United States Patent
Fu et al.

(10) Patent No.: US 9,865,642 B2
(45) Date of Patent: Jan. 9, 2018

(54) RGB-IR PHOTOSENSOR WITH NONUNIFORM BURIED P-WELL DEPTH PROFILE FOR REDUCED CROSS TALK AND ENHANCED INFRARED SENSITIVITY

(71) Applicant: OmniVision Technologies, Inc., Santa Clara, CA (US)

(72) Inventors: Zhenhong Fu, San Jose, CA (US); Dajiang Yang, San Jose, CA (US); Xianmin Yi, Menlo Park, CA (US); Gang Chen, San Jose, CA (US); Sing-Chung Hu, San Jose, CA (US); Duli Mao, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 257 days.

(21) Appl. No.: 14/731,707

(22) Filed: Jun. 5, 2015

(65) Prior Publication Data
US 2016/0358969 A1 Dec. 8, 2016

(51) Int. Cl.
*H01L 27/00* (2006.01)
*H01L 27/146* (2006.01)

(52) U.S. Cl.
CPC .. *H01L 27/14645* (2013.01); *H01L 27/14621* (2013.01); *H01L 27/14649* (2013.01)

(58) Field of Classification Search
CPC ......... H01L 27/14621; H01L 27/14645; H01L 27/14649; H01L 27/14652
USPC ...................................... 250/208.1
See application file for complete search history.

(56) References Cited

U.S. PATENT DOCUMENTS

| | | | |
|---|---|---|---|
| 6,577,342 B1* | 6/2003 | Wester | H01L 27/14621 216/26 |
| 6,586,789 B1* | 7/2003 | Zhao | H01L 27/14656 257/291 |
| 6,756,618 B2* | 6/2004 | Hong | H01L 27/14603 257/292 |
| 2002/0162945 A1* | 11/2002 | Chen | H01L 31/1126 250/214.1 |
| 2004/0100570 A1* | 5/2004 | Shizukuishi | H04N 9/045 348/272 |

(Continued)

FOREIGN PATENT DOCUMENTS

| TW | 201114024 A | 4/2011 |
|---|---|---|
| TW | 201119018 A1 | 6/2011 |

OTHER PUBLICATIONS

English Translation of Taiwan Patent Application No. 105117048 Office Action dated Jan. 6, 2017, 2 pages.

*Primary Examiner* — Georgia Y Epps
*Assistant Examiner* — Kevin Wyatt
(74) *Attorney, Agent, or Firm* — Lathrop Gage LLP

(57) ABSTRACT

A front-side-interconnect (FSI) red-green-blue-infrared (RGB-IR) photosensor array has photosensors of a first type with a diffused N-type region in a P-type well, the P-type well diffused into a high resistivity semiconductor layer; photosensors of a second type, with a deeper diffused N-type region in a P-type well, the P-type well; and photosensors of a third type with a diffused N-type region diffused into the high resistivity semiconductor layer underlying all of the other types of photosensors. In embodiments, photosensors of a fourth type have a diffused N-type region in a P-type well, the N-type region deeper than the N-type region of photosensors of the first and second types.

3 Claims, 2 Drawing Sheets

(56) References Cited

U.S. PATENT DOCUMENTS

| | | | |
|---|---|---|---|
| 2008/0315104 A1* | 12/2008 | Nam | H01L 27/14603 250/370.08 |
| 2010/0102206 A1* | 4/2010 | Cazaux | H01L 27/14603 250/208.1 |
| 2010/0220228 A1* | 9/2010 | Otake | H01L 27/14621 348/311 |
| 2011/0133061 A1 | 6/2011 | Yu et al. | |
| 2012/0314050 A1* | 12/2012 | Nawata | G02B 21/241 348/79 |
| 2016/0133762 A1* | 5/2016 | Blasco Claret | G02B 13/0085 257/432 |

* cited by examiner

US 9,865,642 B2

RGB-IR PHOTOSENSOR WITH NONUNIFORM BURIED P-WELL DEPTH PROFILE FOR REDUCED CROSS TALK AND ENHANCED INFRARED SENSITIVITY

BACKGROUND

Many electronic cameras are used at night or other dim-light situations. These include some camcorders, security cameras, trail cameras, digital night-vision goggles and gunsights, dashcams, and similar products that are often fitted with an invisible, infrared, light source. The infrared source often allows imaging in low light without disturbing or alerting people or animals. While it is desirable for these cameras to resolve color images when bright natural light exists, high sensitivity to infrared light is particularly important for these applications.

Traditional front-side illuminated (FSI), 4-color, red, green, blue, and infrared (RGB-IR) color photosensor arrays typically use a filter matrix having a tiling unit 100 as illustrated in FIG. 1 having at least one red 108, green 104, blue 102, and infrared 106 bandpass filter, where each filter is located over a photosensor. In some embodiments where the blue 102, green 104, and/or red 108 visible-light color filters are partially or fully transparent to infrared light and low crosstalk is desired, a visible-light-passing, infrared blocking filter 109 is added ahead of one or more of visible light color filters 102, 104, 108 at cost of an extra masking step and of reducing sensitivity to infrared light. Traditional FSI RGB-IR photosensor arrays, as illustrated in FIG. 2, also have a blue-detecting N-type diffusion 110, a green-detecting N-type diffusion 112, an infrared-detecting N-type diffusion 114, and a red-detecting N-type diffusion 116 formed into an upper surface of a P-type epitaxial layer 120, in a particular embodiment the P-type epitaxial layer is doped to ten ohms-centimeter resistivity. Each of the N-type diffusions 110, 112, 114, 116 is diffused to the same depth, and form a photodiode junction with the epitaxial layer 120. The N-type diffusions are separated from each other by grounded, P-type, barrier regions 122, 124 that also serve as ground contacts to the epitaxial layer 120. In some, but not all, systems, epitaxial layer 120 is grown on a grounded substrate 126.

Each photodiode 150 (FIG. 3), such as the photodiodes formed by the N-type diffusions 110, 112, 114, 116 with the epitaxial layer 120, is coupled through a selection transistor 152 controlled by a row selection line 153 into precharge and sensing devices 154. Precharge and sensing devices 154 are as known in the RGB photosensor array art, and drives column data line 156.

SUMMARY

In an embodiment, a front-side-imaging (FSI) red-green-blue-infrared (RGB-IR) photosensor array has photosensors of a first type with a diffused N-type region in a P-type well, the P-type well diffused into a high resistivity semiconductor layer; photosensors of a second type, with a deeper diffused N-type region in a P-type well; and photosensors of a third type with a diffused N-type region diffused into the high resistivity semiconductor layer underlying all of the other types of photosensors. In embodiments, photosensors of a fourth type have a diffused N-type region in a P-type well, the N-type region deeper than the N-type region of photosensors of the first and second types.

In an embodiment, a method of receiving images from incident light includes precharging photodiodes of a photosensor array, the photodiodes comprising photodiodes of at least a first, second, and third types. Light is admitted to the photosensor array, which has a tiling unit including a photodiode of the first type overlain by a filter of a first type and having a P-N junction at a first depth, a photodiode of the second type overlain by a filter of a second type and having a P-N junction at a second depth, and a photodiode of the third type overlain by a filter of a third type and having a P-N junction at a third depth. In this array, the filters of the first, second, and third types have differing spectral characteristics, and the first and second depth are unequal. The method continues with detecting the light in photodiodes of the array as a loss of charge, and sensing remaining charge in photodiodes of the array.

DETAILED DESCRIPTION OF THE EMBODIMENTS

Figure 2:
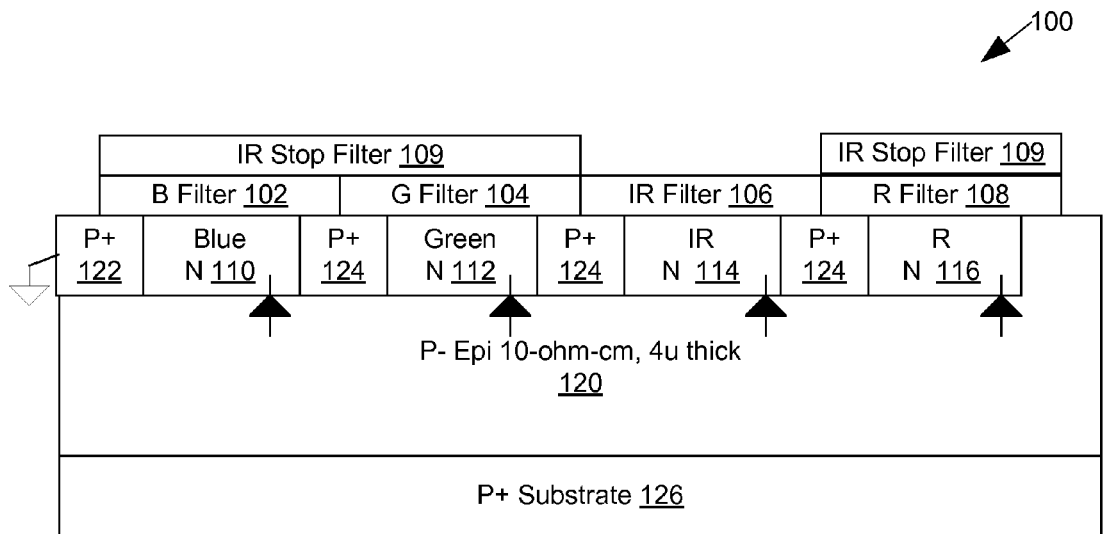
FIG. 2 is a cross sectional schematic view of a PRIOR ART FSI RGB-IR photosensor array.
Figure 1:
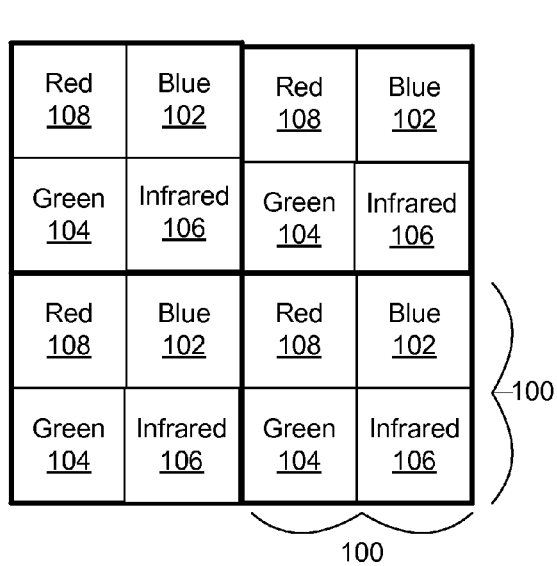
FIG. 1 is a top view of a PRIOR ART color-filter array for an FSI RGB-IR photosensor array.
Figure 3:
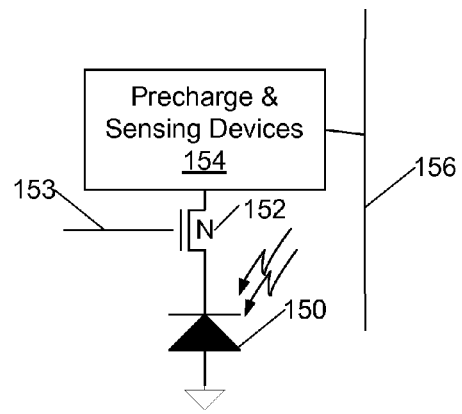
FIG. 3 is a schematic diagram of an individual PRIOR ART FSI RGB-IR photosensor.

It is known that, if a silicon surface is illuminated, remaining unabsorbed light intensity in silicon follows the Beer-Lambert law:

$$I(\lambda)=I_0(\lambda)e^{-\mu(\lambda)x}$$

where $I(\lambda)$ is the intensity at a particular depth at a wavelength $\lambda$, $I0(\lambda)$ is surface intensity at the wavelength, x is depth, and $\lambda$ is wavelength. Although $\mu$ is a function of depth, it is clear that the intensity falls off with depth far more rapidly at short wavelengths, such as blue light, than at long wavelengths, such as red and near-infrared wavelengths. In particular, 90% of blue light will be absorbed in the first micron of depth in silicon, while green light requires five microns and red light ten microns for 90% absorption. Near infrared light in the 800 to 900 nanometer band may not reach 90% absorption until fifty microns depth, and longer wavelength infrared light may require even greater depths to be 90% absorbed.

An improved FSI RGB-IR monolithic photosensor array 200 (FIG. 4) has red, green, blue, and infrared photodiodes optimized for their associated wavelengths; this array has photodiodes of depths different for each color, with photodiodes for longer wavelength bands being formed deeper into the surface than those photodiodes associated with shorter wavelength bands. Each photodiode of the array is overlain by one bandpass color filter, in an embodiment these bandpass filters include a red-pass filter 208 overlying a deep photodiode, a green-pass filter 204 overlying a mid-depth photodiode, a blue-pass filter 202 overlying a shallow photodiode, and an infrared-only-pass filter 206. Each bandpass color filter passes light of one of the three primary visible-light colors red, green, and blue, while blocking light of the other two primary visible-light colors. In an alternative embodiment having good sensitivity to infrared, these bandpass color filters include a red-and-infrared-pass filter 208 that blocks green and blue light overlying a deep photodiode, a green-and-infrared pass filter 204 that blocks red and blue light overlying a mid-depth photodiode, a blue-and-infrared-pass filter 202 that blocks green and red light overlying a shallow photodiode, and an infrared-only-pass filter 206. Since the filters 202, 204, 206, 208 have passbands of different colors, the filters have passbands of differing spectral characteristics. In other embodiments filters 208, 204 and 202 may have a color combination other than red-green-blue, such as cyan-magenta-yellow. In any and all of these combinations the filters include visible color-pass band and infrared-pass band characteristics. In those other embodiments filter 206 is an infrared only-pass band filter that blocks the visible color spectrum while allowing near-infrared light to pass through it.

For purposes of this document, an N+ region is an N-type region (a region having more electron charge carriers than hole carriers) more heavily doped than an N− region, and an N−− (N-double-minus) region is a nearly-undoped or nearly-intrinsic region even more lightly doped than typical N− region but N-type because it has a majority of electron charge carriers. Further, a P+ region is a P-type (a region having more hole carriers than electron charge carriers) region more heavily doped than a P− region, and a P−− (P-double-minus) region is a nearly-undoped or nearly-intrinsic region even more lightly doped P type than is a P− region yet still P type because it has a majority of hole charge carriers.

In an embodiment, blue-associated N+ diffused region 210 is positioned within a P− well 212. Blue N+ region 210 is surrounded by a P+ isolation diffusion 214, 216 (left half) of approximately the same depth. Green N+ diffused region 218 is implanted to a greater depth than blue N+ region 210, and is positioned within a P− well 220 that is deeper than both green N+ region 218 and blue P− well 212, and surrounded by P+ isolation 216, 222 diffused to approximately the same depth as the N+ diffused region 218. Similarly, red N+ diffused region 224 is diffused a depth greater than the blue and green N+ diffusions 210, 218, and is located in a P-well 226 that is both deeper than the red N+ diffused region 224 and deeper than the wells 220, 212, associated with blue and green N+ diffused regions. Again, the red N+ diffused region 224 is surrounded by P+ isolation diffusions 228 that extend beneath the upper surface of the silicon approximately as deep as the red N+ region 224 itself. All of these shapes are formed in what is in an embodiment originally a 10-micron thick, 100-ohm-cm, very-lightly-doped P-type or P−−, epitaxial layer 234; in alternative embodiments the epitaxial layer may have greater thickness or a different high resistivity; in alternative embodiments resistivity is between 50 and 200 ohm-cm, and thickness is between 5 and 15 microns. Finally, a deep infrared N diffused region 230 is provided extending deep into the epitaxial layer 234 to collect carriers both from among those generated from photons absorbed in diffused region 230 and from photons generated in epitaxial layer 234 under surrounding blue or green photodiodes and that diffuse to region 230. Since selectivity between blue light detected by blue-associated N+ diffused region 210 in P− well 212, and infrared light picked up by lightly-doped epitaxial layer 234 and infrared N Region 230 is achieved by penetration, not by filtration, a traditional infrared-blocking filter 109 is not required. Indeed, infrared sensitivity is enhanced by omitting infrared-blocking filter 109.

The blue N+ diffused region 210 forms a P-N junction with its associate P− well 212 at a first depth equal to the depth of the blue N+ diffused region. The green N+ diffused region 218 forms a P-N junction with its associate P− well 220 at a second depth equal to the depth of the green N+ diffused region 218. The red N+ diffused region 224 forms a P-N junction with its associate P− well 226 at a third depth equal to the depth of the red N+ diffused region 218. The first, second, and third depths are unequal as stated above.

In an alternative embodiment, epitaxial layer 234 is a similarly high-resistivity very-lightly-doped N-type or N−− layer. In both embodiments with P−− epitaxial layers and those with N−− epitaxial layers, the very light doping of the epitaxial region allows the junction depletion zone to become quite large, extending under the P− wells of neighboring photodiodes. In a particular embodiment, the N−− epitaxial layer is grown on a P− wafer.

In operation, blue N+ diffused region 210 and P− well 212, with P isolation 214, 216 serving as contacts to the P− well, serve as a PN photodiode for receiving blue light. Green N+ diffused region 218 and P− well 220, with P isolation 216, 222 serving as contacts to the P− well, serve as a PN photodiode for receiving green light. Similarly, Red N+ diffused region 224 and P− well 226, with P+ isolation 228 serving as contacts to the P− well, serve as a PN photodiode for receiving red light. The infrared N diffused region 230, the P−− epitaxial layer 234, and all the P+ isolation regions and P− wells acting together as a P region, serve as a high sensitivity P-I-N photodiode for receiving infrared light. Each N+ diffused region 210, 218, 224, and N diffused infrared region 230 is coupled through a selection transistor similar to the selection transistor 152 known in the art of photosensor arrays to a precharge transistor and sensing devices circuitry block similar to the precharge and sensing circuitry 154 known in the art. In a particular embodiment, the N+ diffused regions has a P+ pinning layer (not shown) at the surface as known in the art of photosensors.

In order to reduce color crosstalk, the depth of the blue N+ diffusion 210 and P− well 212 is chosen such that a high percentage of blue photons will be absorbed in the N+ diffusion and P− well without penetrating beneath into the P−− epitaxial region beneath; in a particular embodiment this depth is approximately a micron, a depth chosen based upon the penetration of blue wavelengths of light into silicon such that 90% of incoming blue photons will be absorbed in these layers. Similarly, in order to reduce color crosstalk, the depth of the green N+ diffusion 218 and P− well 220 is chosen such that a high percentage of green photons will be absorbed in the N+ diffusion and P− well, without penetrating beneath into the P−− epitaxial region beneath; in a particular embodiment this depth is approximately five microns, a depth chosen based upon penetration of green wavelengths of light into silicon such that 90% of incoming green photons will be absorbed in these layers.

Figure 4:
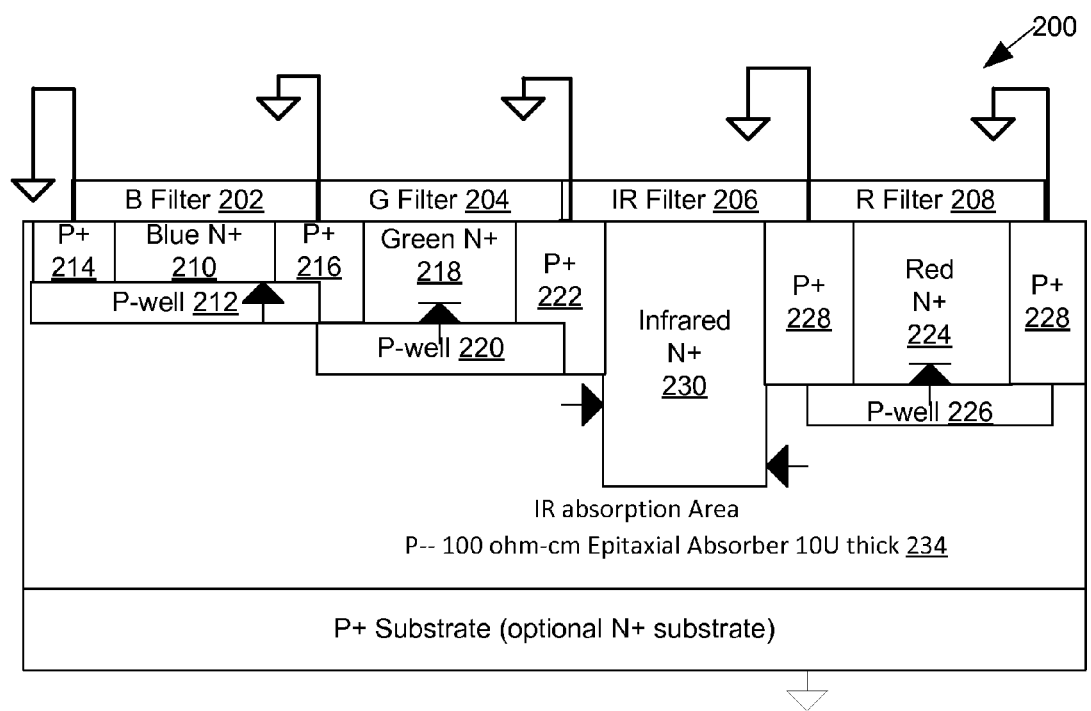
FIG. 4 is a cross sectional schematic view of an improved FSI RGB-IR photosensor array.

Prototypes have been fabricated as herein described. It was observed that peak sensitivity of blue, peak sensitivity of green, and peak sensitivity in red channels of the design of FIG. 4 is better than, that of prior art design of FIG. 2. A significant improvement in infrared and infrared-plus-green sensitivity was observed over the prior design, as well as a significant decrease in crosstalk; in prototypes the blue channel sensitivity to infrared-light was significantly reduced from the prior design.

The blue N+ and P− well regions are shallow enough that only a small percentage of infrared light will be absorbed in them. While the apparatus herein described is functional with conventional bandpass red, green, and blue filters 202, 204, 208, in an alternative embodiment where some color crosstalk is acceptable while infrared sensitivity is paramount, the blue filter is constructed of a material transparent to both infrared and blue light, while blocking both red and green light. In this alternate embodiment, those infrared photons that penetrate the blue N+ and P− well regions may be absorbed in the P−− epitaxial layer 234, creating pairs that may produce photocurrent primarily at the infrared N region 230.

In operation, the photosensor array is operated by precharging the photodiodes of the array. Light is then admitted onto the photosensor array. Blue light is passed by blue filter 202 into the blue photodiode formed by blue N+ 210 and blue well 212, where that light discharges the photodiode proportional to its intensity. Similarly, Green light is passed by green filter 204 into the green photodiode formed by green N+ 218 and green well 220, where that light discharges the photodiode proportional to its intensity. Red light is passed by red filter 208 into the red photodiode formed by red N+ 224 and red well 226, where that light discharges the photodiode proportional to its intensity. Infrared light is admitted through infrared filter 206, and in some embodiments through blue filter 202 and/or green filter 204, and generates pairs in the infrared N region 230 or in the epitaxial layer 234, these pairs discharge the photodiode formed by infrared N region 230, epitaxial layer 234, and the P isolation diffusions 214, 216, 222, 228, and P wells 212, 220, 226 proportional to its intensity. The level of remaining charge on the photodiodes is then sensed by sensing devices and a signal determined by that remaining charge is placed on column sense lines of the array.

While the foregoing discussion has focused on a photosensor array incorporating red, green, and blue photodiodes having N+ diffused regions in P− wells diffused into a silicon epitaxial layer, we note that silicon is a semiconductor, and that similar structures can be created in alternative group IV semiconductors including diamond, silicon or germanium, group III-V semiconductors including gallium arsenide, gallium arsenide phosphide, and others. In particular, materials having a lower bandgap than silicon, such as gallium arsenide or germanium, offer greater sensitivity to long-wavelength infrared light than does silicon. The penetration depth versus wavelength characteristics will differ between semiconductor materials. Construction of similar structures in non-silicon semiconductor materials may allow creation of photosensors with peak sensitivity not just in red, green, blue, and near-infrared as herein described, but at red, green, blue, and several different wavelengths of infrared. Photosensor arrays having photosensors of several different types each with sensitivity to different bands of infrared light offers the ability to, for example, display temperature of objects in the field of view.

In the semiconductor art, N or P "type" depends on impurities, such as phosphorous, arsenic, or boron, present in a semiconductor. These impurities are typically inserted into the semiconductor in one of three ways, they may be present during crystal growth, such a small amount of phosphine gas present during epitaxial growth; they may be applied as a surface dopant to a semiconductor surface in gaseous or solid form and driven into the semiconductor through heat-driven diffusion; or they may be driven into the semiconductor through ion implantation with a heavy-ion particle accelerator known as an ion-implanter, and then activated and spread by heat-driven annealing and diffusion. Typically, both ion-implanted and gas or solid surface dopants are defined in shape by a masking step or steps. For purposes of this document, the term "diffused region" refers to a region of shape dependent on one or more masking steps, in which type, amount, or depth of impurities present differ from other, surrounding, regions in the semiconductor without regard to whether the impurities were applied as a gaseous or solid surface dopant, by ion implantation, or through some other method; and without regard to whether the masking steps that define shape of the diffused region use visible light, ultraviolet light, x-rays, or a particle beam such as an electron beam to expose any photoresist used during the masking steps.

Combinations

The various features of the herein described embodiments may be combined in various ways. In particular, 2, 3, or more than 3, photodiodes having N-regions of various depths in P-wells and filters may be used with a single long-wave deep photodiode in each tiling where a 3-band or a hyperspectral (more than 4 band) system is desired instead of the RGB-IR 4-band system herein described. Among other combinations that may arise in systems are:

A front-side-imaging (FSI) red-green-blue-infrared (RGB-IR) photosensor array designated A and including multiple photosensors of a first type, where each photosensor of the first type has a diffused N-type region in a P-type well, the P-type well diffused into a high resistivity semiconductor layer; multiple photosensors of a second type, where each photosensor of the second type has a diffused N-type region in a P-type well, the P-type well diffused into the high resistivity semiconductor layer; and multiple photosensors of a third type having a diffused N-type region diffused into the high resistivity semiconductor layer with no surrounding P-well. In this photosensor array, the diffused N-type regions of the photo sensors of the first type are diffused to a first depth; the diffused N-type regions of the photo sensors of the second type are diffused to a second depth, the first and second depth being different; with the P-type wells of the photosensors of the first type are diffused to a third depth and the P− wells of the photosensors of the second type are diffused to a fourth depth.

A FSI RGB-IR photosensor array designated AA including the array designated A wherein the semiconductor layer is a silicon semiconductor layer.

An FSI RGB-IR photosensor array designated AB including the array designated A or AA further including multiple photosensors of a fourth type, where each photosensor of the fourth type has a diffused N-type region in a P-type well, the P-type well diffused into the high resistivity semiconductor layer; where the diffused N-type regions of the photosensors of the fourth type are diffused to a fifth depth; the P− well regions of the photosensors of the fourth type are diffused to a sixth depth, the first, second and fifth depth being different.

An FSI RGB-IR photosensor array designated AC including the array designated AB wherein the third, fourth, and sixth depth are different.

An FSI RGB-IR photosensor array designated AD including the array designated A, AB, AC, or AA wherein photosensors of the first type are separated from photosensors of the second type by a P+ isolation diffusion.

An FSI RGB-IR photosensor array designated AE including the array designated A, AA, AB, AC or AD, further including a first bandpass color filter transparent to infrared light overlying photosensors of the first type and a second bandpass color filter transparent to infrared light overlying photosensors of the second type, the second bandpass color filter transparent to a different color of visible light than the first bandpass color filter.

An FSI RGB-IR photosensor array designated AF including the array designated A, AA, AB, AC or AD, further including a infrared only-pass filter overlying photosensors of the third type.

A method of receiving images from incident light designated B and including precharging photodiodes of a photosensor array, the photodiodes comprising photodiodes of at least a first, second, and third types; and admitting light to the photosensor array, the array having a tiling unit including a photodiode of the first type overlain by a filter of a first type and having a P-N junction at a first depth, a photodiode of the second type overlain by a filter of a second type and having a P-N junction at a second depth, and a photodiode of the third type overlain by a filter of a third type and having a P-N junction at a third depth. In this method, the filters of the first, second, and third types have differing spectral characteristics, and the first and second depth are unequal. The method also includes detecting the light in photodiodes of the array as a loss of charge; and sensing remaining charge in photodiodes of the array.

A method of receiving images designated BA and including the method designated B, the photosensor array further including a photodiode of a fourth type, the photodiode of the fourth type comprising a deep absorber underlying the photodiodes of the first and second types. layer having resistivity of at least 50 ohms-cm.

A method of detecting a color image designated C, the image having at least a first color corresponding to a first wavelength band, includes projecting the image onto a monolithic photosensor array having a plurality of tiling units, where each tiling unit has at least a first and a second photosensor type; receiving in the photosensors of the first type of the array photons of the first wavelength band; receiving at least some photons of a second wavelength band through the photosensors of the first type of the array into an underlying high-resistivity epitaxial photon-absorbing region of photosensors of the second type of the array; and reading the photosensors of the array.

A method designated CA including the method designated C wherein each tiling unit of the photosensor array comprises a third photosensor type, and further including receiving in the third photosensor type photons of a third wavelength band; and passing at least some photons of the second wavelength band through photosensors of the third type into the underlying high-resistivity epitaxial photon-absorbing region of the photosensor of the second type.

A method designated CB including the method designated C or CA wherein each tiling unit of the photosensor array comprises a fourth photosensor type, and further including receiving in the photosensor s of the fourth type photons a fourth wavelength band; wherein the second wavelength band is infrared and the first wavelength band includes blue light.

For purposes of this document, the term "wavelength band of light" includes light of an embodiment-specific subset of the visible and/or near-infrared portions of the electromagnetic spectrum. In a particular embodiment, a first wavelength band may correspond to blue visible light of approximately 380 to 450 nanometers wavelength, such a band has a lower approximate wavelength limit of 380 nanometers and an upper approximate wavelength limit of 450 nanometers. In this embodiment, a second wavelength band may correspond to green visible light of approximately 490-570 nanometers wavelength, a third wavelength band corresponding to red visible light of approximately 620-740 nanometers wavelength, and a fourth wavelength band corresponding to near-infrared light of approximately 780 to 1000 nanometers wavelength. In other embodiments, wavelength bands may be broader and may overlap somewhat, in an embodiment a "red"-centered wavelength band and a "green"-centered wavelength band may overlap in yellow and orange light from 570-620 nanometers wavelength; in other embodiments wavelength bands may be narrower and more numerous. Wavelength bands differ if there is a significant difference between their upper wavelength limits or between their lower wavelength limits.

While the invention has been particularly shown and described with reference to embodiments thereof, it will be understood by those skilled in the art that various other changes in the form and details may be made without departing from the spirit and scope of the invention. It is to be understood that various changes may be made in adapting the invention to different embodiments without departing from the broader inventive concepts disclosed herein and comprehended by the claims that follow.

What is claimed is:

1. A method of detecting a color image comprising:
   projecting the image onto a monolithic photosensor array having a plurality of tiling units, where each tiling unit has at least a first and a second photosensor type;
   receiving in the photosensors of the first type of the array photons of a first wavelength band;
   receiving at least some photons of a second wavelength band through the photosensors of the first type of the array into an underlying high-resistivity epitaxial photon-absorbing region of photosensors of the second type of the array; and
   reading the photosensors of the array;
   wherein the first and second wavelength band are different.

2. The method of claim 1 wherein each tiling unit of the photosensor array comprises a third photosensor type, and further comprising:
   receiving in the photosensors of the third type photons of a third wavelength band; and
   passing at least some photons of the second wavelength band through the photosensors of the third type into the underlying high-resistivity epitaxial photon-absorbing regions of photosensors of the second type;
   wherein the third wavelength band differs from the first and second wavelength bands.

3. The method of claim 2 wherein each tiling unit of the photosensor array comprises a fourth photosensor type, and further comprising:
   receiving in the fourth photosensor type photons of a fourth wavelength band, the fourth wavelength band differing from the first, second, and third wavelength band;
   wherein the second wavelength band is in the infrared and the first wavelength band includes blue visible light.

* * * * *